United States Patent
Manteghi

[11] Patent Number: 5,847,455
[45] Date of Patent: Dec. 8, 1998

[54] MOLDED LEADFRAME BALL GRID ARRAY

[75] Inventor: Kamran Manteghi, Manteca, Calif.

[73] Assignee: VLSI Technology, Inc., San Jose, Calif.

[21] Appl. No.: 554,688

[22] Filed: Nov. 7, 1995

[51] Int. Cl.[6] .................................................. H01L 23/48
[52] U.S. Cl. .......................................... 257/737; 257/738
[58] Field of Search .................................. 257/674, 737, 257/738, 734, 493, 735

[56] References Cited

U.S. PATENT DOCUMENTS

| | | | |
|---|---|---|---|
| 5,133,495 | 7/1992 | Angulas et al. | 228/180.1 |
| 5,137,845 | 8/1992 | Lochon et al. | 437/183 |
| 5,147,084 | 9/1992 | Behun et al. | 228/56.3 |
| 5,172,214 | 12/1992 | Casto | 257/737 |
| 5,261,155 | 11/1993 | Angulas et al. | 29/830 |
| 5,276,964 | 1/1994 | Anderson, Jr. et al. | 29/853 |
| 5,337,219 | 8/1994 | Carr et al. | 361/794 |
| 5,341,980 | 8/1994 | Nishikawa et al. | 228/205 |
| 5,433,822 | 7/1995 | Mimura | 257/737 |
| 5,608,265 | 3/1997 | Kitano | 257/738 |
| 5,663,594 | 9/1997 | Kimura | 257/737 |
| 5,668,405 | 9/1997 | Yamashita | 257/737 |

OTHER PUBLICATIONS

"High–Pincount PBGAs Implementation" by Bruce Freyman and Michael Petrucci, Advanced Packaging Magazine, May/Jun. 1995.

"High Performance Package" Product Announcement by Olin Interconnect Technologies, Manteca, California, pp. 146–152.

BGA Technology: Current and Future Direction For Plastic, Ceramic and Tape BGAs by David Walshak and Hassan Hashemi, MCC, Austin Texas, pp. 157–160.

"Ball Grid Array Packaging" by M.S. Cole and T. Caulfield, IBM Microelectronics, Hopewell Junction, NY, pp. 147–152.

*Primary Examiner*—A. Zarabian
*Attorney, Agent, or Firm*—Patrick T. King

[57] ABSTRACT

A ball grid array (BGA) package configuration for packaging an integrated-circuit die includes a lead frame having a plurality of inwardly-extending bonding fingers and a centrally-located die-attach pad. The bonding fingers are disposed peripherally surrounding the die-attach pad. An integrated-circuit die is mounted on the die-attach pad. Bonding fingers are interconnected between the bonding pads on the integrated-circuit die and the plurality of bonding fingers. A plastic material is molded over the top of the lead frame and the die while still providing an exposed bottom surface of the bonding fingers on the lead frame. A solder mask is disposed over the bottom of the lead frame so as to form selective solder areas. Solder balls are attached to the selective solder areas.

10 Claims, 1 Drawing Sheet

MOLDED LEADFRAME BALL GRID ARRAY

BACKGROUND OF THE INVENTION

This invention relates generally to semiconductor integrated circuit packages and more particularly, it relates to an improved ball grid array (BGA) package.

As is generally known in the art of integrated circuit packaging, an integrated-circuit die is typically attached to a die-attach pad, which is located at the central region of a conventional lead frame. In particular, the lead frames are manufactured in long strips of many individual units. These long strips can be made long enough in order to accommodate any number of lead frames.

Further, the lead frames may be formed with carrier rails and guide holes for positioning the same during manufacturing. Each lead frame consists of a plurality of internal and external leads, tie bars, and the die-attach pad. The die-attach pad provides a surface on which the die may be mounted. The lead frames vary in their sizes dependent upon the size of the die and the number of connections required to be made to the die.

Conventional lead frame plating processes will provide lead frames that have clean, non-reactive finishes. During packaging, the die is mounted to the die-attach pad. Bonding pads are provided on the surface of the die and are connected to the internal leads of the lead frame by bonding wires in accordance with known techniques. In order to improve the thermal performance of a package, a thermally-conductive electrically-insulated substrate formed of, for example, a glass epoxy material or the like is either attached to the die-attach pad via a layer of adhesive or is used to replace the same. In the case where the substrate replaces the die-attach pad of the conventional lead frame, the die is mounted directly to the substrate. The substrate may be in the form of a printed circuit board having conductive traces disposed on its top surface. Bonding wires are used to join the pads on the die to the conductive traces. Then, the die-attached pad/substrate, die leads, and associated connections are encapsulated in an encapsulating material such as a plastic molding compound. A ball grid array (BGA) package provides an array of solder balls on its lower surface. After encapsulation of the die and the lead frame with the plastic molding material, the solder balls are attached and the packages are singulated.

One of the most critical steps in the BGA process is the molding step. What is needed is a low-stress molding compound which can provide good adhesion to the substrate. Delamination of the encapsulating material from the substrate is a common problem encountered in BGA integrated circuit packages. There are a number of reasons why this problem may occur, such as improper curing of the encapsulating material, surface contamination of the substrate, or warpage between the encapsulating material and the substrate. Further, another reason for encapsulating material failure is because of the thermal mismatch between dissimilar materials of the substrate and the encapsulating material.

A BGA integrated circuit package utilizing a substrate also has the disadvantage of being more expensive because of the additional cost of the substrate itself and the additional cost of assembling a package with a substrate. Consequently, it is desirable to provide a BGA package which has a relatively simple construction and which is inexpensive to manufacture.

SUMMARY OF THE INVENTION

Accordingly, it is a general object of the present invention to provide an improved BGA package which is relatively simple in its construction and is easy to manufacture and assemble.

It is an object of the present invention to provide an improved BGA package which includes a molded or encapsulated lead frame having its bottom side exposed so that solder balls can be attached thereto after molding or encapsulation.

It is another object of the present invention to provide an improved BGA package configuration for packaging an integrated-circuit die which reduces the problems of delamination.

It is still another object of the present invention to provide an improved BGA package which eliminates the need for an expensive substrate.

In accordance with these aims and objectives, the present invention is concerned with the provision of a ball grid array package configuration for packaging an integrated-circuit die which includes a lead frame having a plurality of inwardly-extending bonding fingers and a centrally-located die-attach pad. The bonding fingers are disposed peripherally surrounding the die-attach pad. An integrated-circuit die is mounted on the die-attach pad. Bonding wires are interconnected between the bonding pads on the integrated-circuit die and the plurality of bonding fingers.

A plastic material is molded or dispensed over the top of the lead frame and the die while still providing an exposed bottom surface of the bonding fingers on the lead frame. A solder mask is disposed over the bottom of the lead frame so as to form selective solderable areas. Solder balls are attached to the selective solder areas to provide a BGA package.

BRIEF DESCRIPTION OF THE DRAWINGS

The accompanying drawings, which are incorporated in and form a part of this specification, illustrate embodiments of the invention and, together with the description, serve to explain the principles of the invention.

DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Figure 1:
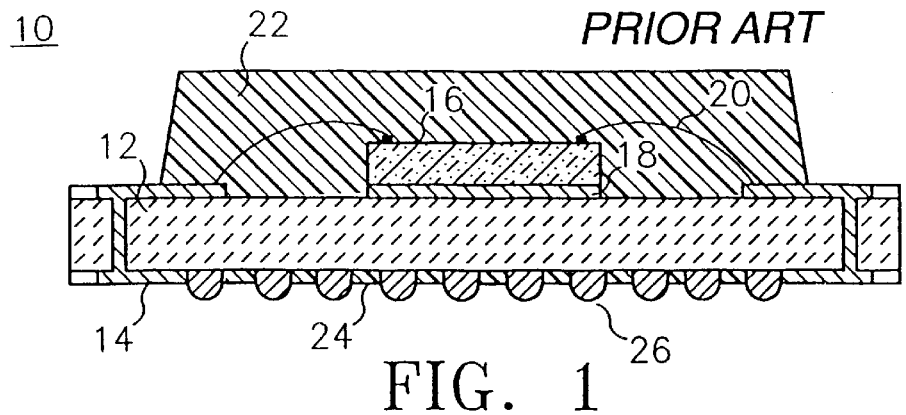
FIG. 1 is a sectional, elevational view of a prior art BGA package for an integrated circuit utilizing a thermal-conductive, electrically-insulated substrate.

In FIG. 1, there is illustrated a sectional, elevational view of a conventional BGA (ball grid array) package of the prior art which includes a thermally-conductive, electrically-insulated substrate 12. The top and bottom surfaces of the substrate 12 are provided with metal traces or pads 14. The semiconductor die or chip 16 is connected to the central region of the substrate 12 via a die-attach area 18. Gold wire bonds 20 are used to interconnect the chip 16 to the substrate 12. After the die bonding process, the substrate 12 is molded with a molding compound 22. Then, a solder mask 24 is provided and the solder bumps or balls 26 are attached to the pads 14 on the bottom surface of the substrate 12. Finally, the packages are singulated.

As previously pointed out, this prior art BGA package 10 suffers from the problem of delamination due to warpage of the substrate 12 during the molding process. As a result, this adversely affects the subsequent solder ball attachment step where the solder balls are melted to form solder connections between the BGA package and a printed circuit board. While it is possible to alleviate the problem of warpage by increasing the thickness of the substrate 12 with high-modulus resins, this will in turn create the disadvantage of higher material expense and thus increase manufacturing costs.

The inventor of the present invention has developed an improved technique for fabricating a BGA package without the need of utilizing an expensive thermally-conductive, electrically-insulated substrate like that of the prior art in FIG. 1. As a result, there is provided an improved BGA package which is reliable and low-cost to manufacture and assemble.

Figure 2:
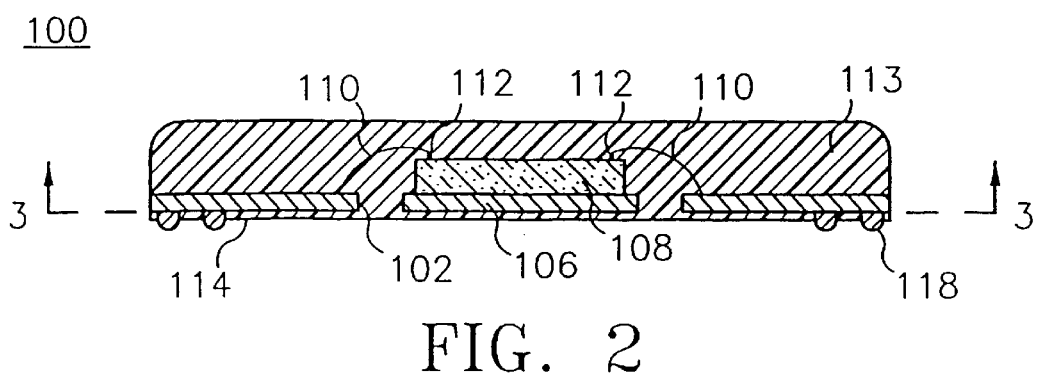
FIG. 2 is a sectional elevational view of an improved BGA package, constructed in accordance with the principals of the present invention.
Figure 3:
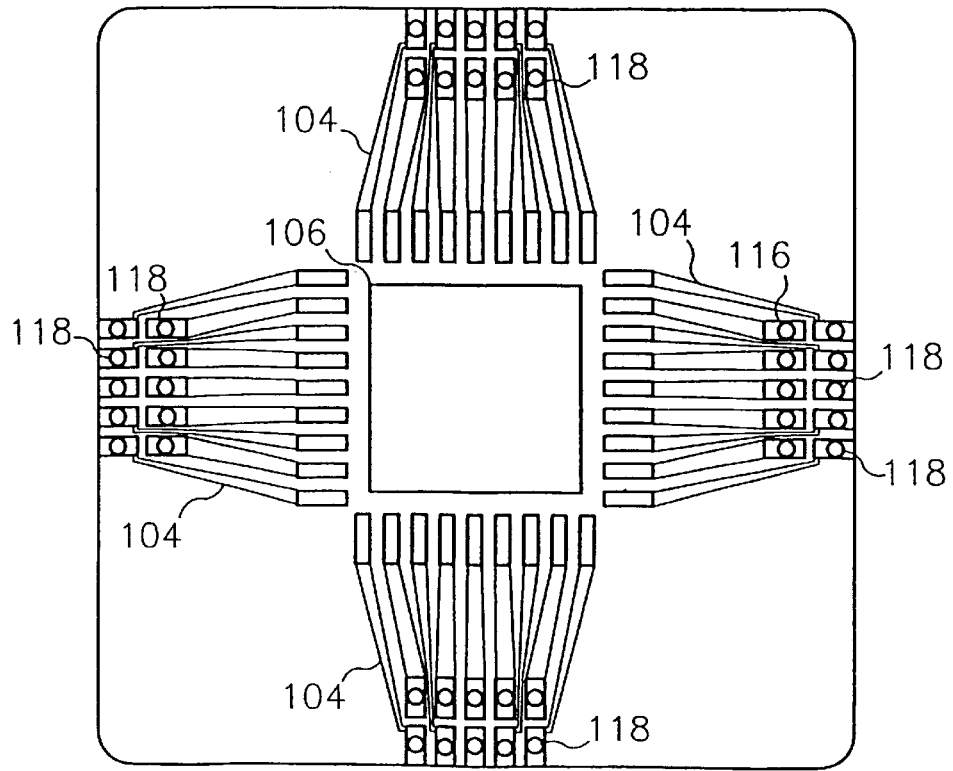
FIG. 3 is a cross-sectional view taken along the lines 3—3 of FIG. 2.

Referring now to FIGS. 2 and 3 of the drawings, there is shown an improved BGA (ball grid array) package 100 which is constructed in accordance with the principles of the present invention. The BGA package 100 includes a specially-designed lead frame 102 having a plurality of thin, closely-spaced conductive leads 104. The conductive leads 104 are arrayed on four sides of and define the size and shape of a centrally-located dieattach paddle or pad 106 of the lead frame 102. The lead frame 102 is typically stamped or chemically etched from a sheet of lead frame material.

The types of suitable lead frame material include copper, iron, nickel, aluminum, or alloys containing these metals. Further, the conductive leads 104 may be plated with a highly conductive metal such as silver, copper, gold, or palladium.

A semiconductor integrated-circuit chip or die 108 is mounted to the die-attach pad 106 of the lead frame 102. The innermost ends of the conductive leads 104 are called bonding fingers. Very thin gold wires 110 are bonded between corresponding ones of bonding pads 112 formed on the surface of the die 108 and corresponding ones of the bonding fingers on the lead frame 102. It will be noted that the bonding fingers extend inwardly toward the centrally-located die-attach pad 106 and are arranged so as to peripherally surround the die-attach pad.

After the die-attach and wire bonding process, the lead frame and die subassembly is placed in a cavity, and a plastic molding compound 113 is injected or an epoxy encapsulant is dispensed into a top side of the cavity. The encapsulating compound then flows over the die 108 and the lead frame 102, but is prevented from flowing to the other side of the lead frame. As a result, the flow of the encapsulating or molding compound is restricted to the top surface of the lead frame and die subassembly so that the underneath or bottom surface of the lead frame is left exposed. The encapsulating or molding compound may, for example, be a standard molding compound such as provided by the Sumitomo Company as 6300 HS or HG molding compound, as 7320C low viscosity molding compound, or as HYSOL 4323 encapsulation material.

After the encapsulation or molding process of the subassembly, a solder mask 114 is applied, preferably using a screen printing or by photo-imaging procedures known in the art. During such a procedure, the entire bottom surface of the subassembly is covered with a compatible material, except for selective solderable areas 116, where it is desired to have applied solder balls, and is subsequently cured. Finally, the solder balls 118 are attached to the selective solder areas 116. The solder balls are covered with a derivative of tin-lead solder bumps, preferably 60% Sn and 40% Pb so as to reflow during a next assembly process for joining the solder balls both to the next-level printed circuit board. One technique which may be used for mounting the solder balls to the selective solder areas 116 on the bottom of the lead frame 102 is the so-called C-4 (controlled collapse chip connection) technology.

Unlike the prior art of FIG. 1 there has been eliminated in the BGA package 300 of the present invention the use of a substrate, thereby simplifying its construction. As a result, the present technique for fabricating a BGA package for an integrated-circuit die is relatively less expensive to manufacture and assemble.

From the foregoing detailed description, it can thus be seen that the present invention provides an improved ball grid array package configuration for packaging an integrated-circuit die which is of a relatively simple construction and is low-cost to manufacture and assemble. The BGA package of the present invention includes an integrated-circuit die which is mounted to a centrally-located die-attach pad of a lead frame. A plastic material is molded or dispensed over the top, of the lead frame and the die while still providing an exposed bottom surface of a plurality of bonding fingers on the lead frame so that solder balls can be attached thereto after the encapsulation or molding process.

What is claimed is:

1. A ball grid array package configuration having no substrate for packaging an integrated-circuit die comprising:
   a lead frame having a plurality of inwardly-extending bonding fingers and a centrally-located die-attach pad, said bonding fingers being disposed peripherally surrounding said die-attach pad;
   an integrated-circuit die being directly mounted on said die-attach pad;
   bonding wires interconnected between bonding pads on said integrated-circuit die and said plurality of bonding fingers;
   a plastic material being encapsulated over the top of said lead frame and said die while still providing an exposed bottom surface of said bonding fingers on said lead frame;
   a solder mask layer being disposed over the exposed bottom surface of said lead frame so as to form selective solderable areas; and
   solder balls being attached to said selective solderable areas.

2. A ball grid array package configuration as claimed in claim 1, wherein said lead frame is stamped or chemically etched from a sheet of lead frame material.

3. A ball grid array package configuration as claimed in claim 2, wherein said lead frame material is a metal.

4. A ball grid array package configuration as claimed in claim 3, wherein said metal is selected from the group consisting of copper, iron, nickel, aluminum, and alloys thereof.

5. A ball grid array package configuration as claimed in claim 4, wherein said bonding fingers are plated with a highly conductive metal.

6. A ball grid array package configuration as claimed in claim 5, wherein said highly conductive metal is selected from the group consisting of silver and gold.

7. A ball grid array package configuration as claimed in claim 1, wherein said plastic material is an epoxy encapsulant.

8. A ball grid array package configuration as claimed in claim 1, wherein said solder mask is applied by a screen printing process.

9. A ball grid array package configuration as claimed in claim 1, wherein said solder balls are comprised of lead-tin derivative solder bumps.

10. A ball grid array package configuration as claimed in claim 9, wherein said solder bumps are comprised of Sn and Pb.

* * * * *